(12) United States Patent
Gardner et al.

(10) Patent No.: US 6,592,401 B1
(45) Date of Patent: Jul. 15, 2003

(54) COMBINATION CONNECTOR

(75) Inventors: Michael J. Gardner, Geneva, IL (US); Jerry D. Kachlic, Glen Ellyn, IL (US); Scott D. Sommers, Naperville, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/080,735

(22) Filed: Feb. 22, 2002

(51) Int. Cl.[7] .............................................. H01R 13/73
(52) U.S. Cl. .................... 439/544; 439/101; 439/924.1
(58) Field of Search ................................ 439/544, 101, 439/924.1, 60, 65; 361/785, 788, 807

(56) References Cited

U.S. PATENT DOCUMENTS

| 4,191,440 A | | 3/1980 | Schramm ..................... 339/17 |
|---|---|---|---|
| 4,227,238 A | * | 10/1980 | Saito ........................... 439/101 |
| 4,776,811 A | | 10/1988 | Humphrey ................... 439/378 |
| 4,790,762 A | | 12/1988 | Harms, deceased et al. .. 439/59 |
| 5,017,146 A | * | 5/1991 | Uehara et al. ................ 439/65 |
| 5,154,618 A | * | 10/1992 | Nikoloff et al. .............. 439/67 |
| 5,161,998 A | * | 11/1992 | Defibaugh et al. .......... 439/544 |
| 5,397,241 A | | 3/1995 | Cox et al. ..................... 439/79 |
| 5,411,409 A | | 5/1995 | Gray et al. .................. 439/329 |
| 5,540,598 A | | 7/1996 | Davis .......................... 439/79 |
| 6,095,825 A | | 8/2000 | Liao .......................... 439/76.1 |
| 6,217,228 B1 | * | 4/2001 | Samela et al. .............. 439/101 |
| 6,250,940 B1 | | 6/2001 | Kung .......................... 439/218 |
| 6,377,471 B1 | * | 4/2002 | Chong et al. ............. 439/928.1 |

* cited by examiner

*Primary Examiner*—Tho D. Ta
*Assistant Examiner*—Briggitte Hammond
(74) *Attorney, Agent, or Firm*—Robert J. Zeitler

(57) ABSTRACT

A connector is capable of mating with a backplane. The connector includes a housing having at least a first portion and a second portion. The first portion of the housing transmits a first transmission to the backplane and the second portion of the housing transmits a second transmission through the backplane without transmitting the second transmission to the backplane.

23 Claims, 2 Drawing Sheets

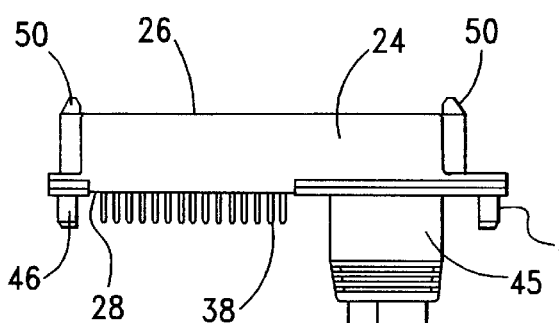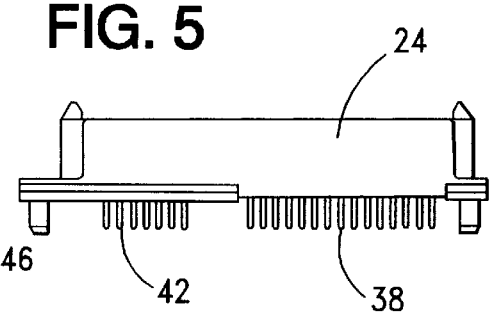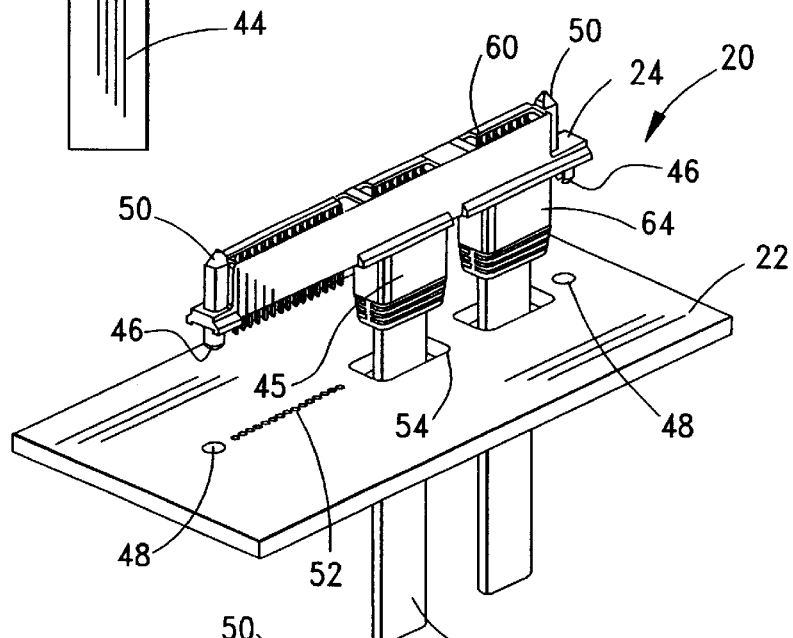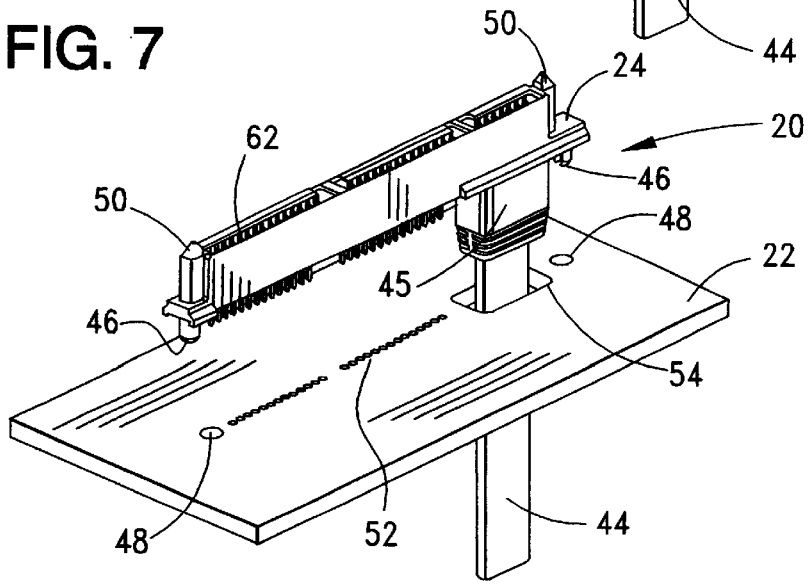

COMBINATION CONNECTOR

FIELD OF THE INVENTION

This invention is generally directed to a combination connector which is connected to a backplane or bulkhead type structure and which is used to pass power and signal therethrough in which the power is isolated from the signal, or to pass two different types of transmission sets therethrough in which the first transmission set is isolated from the second transmission set.

BACKGROUND OF THE INVENTION

Prior art connectors which connect to a backplane route signal and power through a common backplane. When dealing with relatively low speed signals or clean power feeds, any signal degradation resulting from passing both power and signal through a common backplane does not result in any real degradation of the signal quality as a result of interference that may be generated by the power signals being routed through the backplane. However, with today's requirement to pass signals at ever increasing speeds and potentially contaminated or noisy power feeds, the interference being generated by passing both power and signal through a common backplane creates interferences that result in unacceptable degradation of the high speed signals. To overcome these problems in the past, designers have had to design complex circuit boards that would be capable of passing both power and high speed signals therethrough while at the same time preventing electrical interference so as to not cause unacceptable signal degradation.

Additionally, combinations with fiber optics was generally avoided due to the complexities encountered in routing fiber optic signals directly onto a backplane.

A combination connector which overcomes the problems presented in the prior art and which provides additional advantages over the prior art is provided. Such advantages will become clear upon a reading of the attached specification in combination with a study of the drawings.

OBJECTS AND SUMMARY OF THE INVENTION

A general object of the present invention is to provide a novel combination connector which is connected to a backplane or bulkhead and which is used to pass power and signal therethrough in which the power is isolated from the signal, or to pass two different types of signal sets therethrough in which the first signal set is isolated from the second signal set.

An object of the present invention is to provide a novel combination connector which maintains signal integrity.

Another object of the present invention is to provide a novel combination connector which connects to a backplane in which the backplane used is less expensive than backplanes used with prior art connectors. It has been found that by moving alternate signal or power sets out of the backplane and into a bypass transmission media, in certain cases backplane costs can be reduced.

The combination connector of the present invention overcomes these problems noted in the prior art by isolating the power and high speed signals or multiple signal sets in a manner that offers both cost and performance benefits that cannot be achieved by traditional methods. This is because the circuit board that the combination connector of the present invention is mounted on is simplified because it only has to route power or signal sets, and not both power and signals. This is particularly significant in the instance of high speed signals and/or power, because interference from the power being routed through a circuit board that routes both power and high speed signals can result in a degradation of the signal quality of the high speed signals and/or the power can be contaminated by an overlay of aggressive high speed signals. Alternatively, more complex and expensive boards, i.e., boards requiring additional layers to provide for isolation between the transmissions received by the board, had to be devised to handle both power and high speed signals so as to not have an unacceptable degradation of the signal quality of the high speed signals.

Briefly, and in accordance with the foregoing, a connector capable of mating with a backplane is provided that only routes one of the transmission sets being passed through the connector directly to the backplane that it is connected to, for example, power. The other transmission set being passed through the connector, such as high speed signals, does not get routed to the same backplane as the connector is mounted on, but rather, is routed elsewhere, such as another circuit board or electronic device. In this case, the connector acts as a passive alignment tool to pass the selected transmission set through the connector and on to an alternate termination point.

In one embodiment of the combination connector of the present invention, the connector includes a housing, a first set of terminals provided within the housing, a second set of terminals provided within the housing and being electrically isolated from the first set of terminals. The first set of terminals is capable of mating with the backplane in a conventional manner. The second set of terminals may be connected to a cable extending from the housing so as to not pass the electrical signals being passed through the second set of terminals to the backplane on which the combination connector is mounted. One of the first set of terminals and the second set of terminals is used to pass power or signal through the housing to the backplane and the other of the first set of terminals and the second set of terminals used to pass signal through the housing without passing the signal to the backplane.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which:

FIG. 3 is a side elevational view of the combination connector;

FIG. 5 is a side elevational view of the combination connector without a flexible cable attached thereto;

FIG. 6 is a perspective view of an alternate combination connector which incorporates the features of the invention and a backplane: and FIG. 7 is a perspective view of a further alternate combination connector which incorporates the features of the invention and a backplane.

DETAILED DESCRIPTION OF THE ILLUSTRATED EMBODIMENTS

Figure 1:
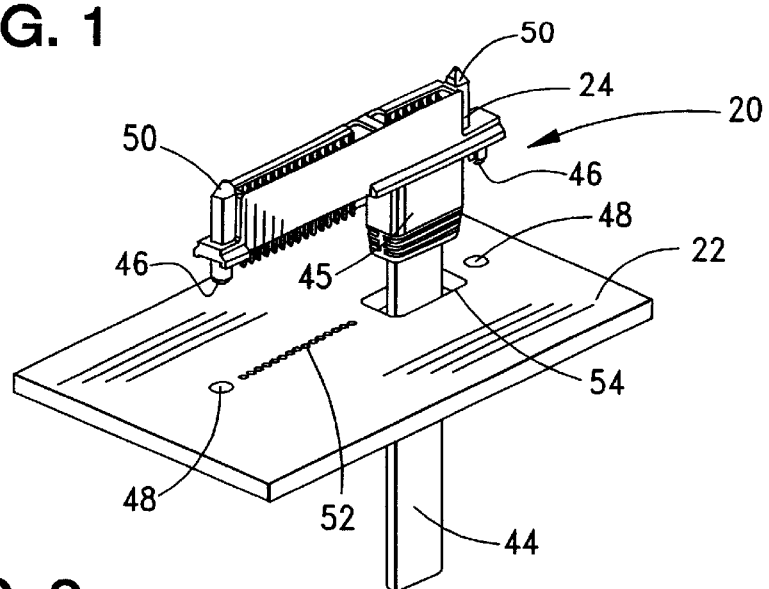
FIG. 1 is a perspective view of a combination connector which incorporates the features of the invention and a backplane.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

A combination connector 20 is used to for transmission, which is the process of conducting radiant energy through a transmission medium. This includes, but is not limited to, optical and electrical transmission.

In one embodiment of the combination connector 20, the combination connector is used to pass power and signal therethrough in which the power set is isolated from the signal set. Alternatively, two different types of transmission sets are passed therethrough in which the first transmission set is isolated from the second transmission set. This combination connector 20 is particularly suitable for use in high speed systems. For example, the combination connector 20 can be used to pass electrical power and electrical signal therethrough, electrical signal and optical signal therethrough, or optical signal and electrical power therethrough or any other combination of transmissions The combination connector 20 is adapted for mounting to a backplane 22, see FIGS. 1 and 2, and can be used in an electronic enclosure, such as a server or a router which contains a backplane or mid-plane for the attachment of sub-components or devices such as hard drives, tape drives, DVDs, compact discs and the like. Both the sub-components and the hard drives require a single attachment point which provide power and signal. In the application where power is bussed across the backplane 22 to the combination connector 20, the signal does not enter the backplane 22 and instead directly connects to the sub-component or device.

The combination connector 20 has a dielectric housing 24 having a first end 26 and a second end 28. As shown, the housing 24 is elongated and rectangular, but can take other suitable forms.

Figure 4:
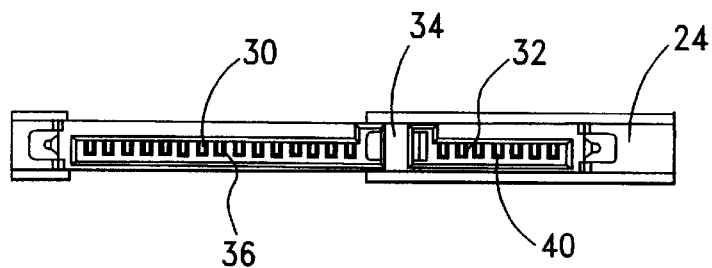
FIG. 4 is a top plan view of the combination connector.

As shown in FIG. 4, first and second passageways 30, 32 are provided through the housing 24 from the first end 26 to the second end 28 and are separated from each other by a dielectric wall 34. The wall 34 may be integrally formed with the housing 24 or as a separate component which is suitably attached to the housing 24. Alternatively the dielectric wall 34 could be replaced by a conductive shielding wall in the event additional electrical separation is desired.

A first set of terminals 36 are provided within the first passageway 30 and extend through the housing 24 generally from the first end 26 to the second end 28. Each terminal 36 in the first set includes a tail portion 38 which extends from the second end 28 of the housing for 24 attachment to the backplane 22 in a conventional manner. A second set of terminals 40 are provided within the second passageway 32 and extend through the housing 24 generally from the first end 26 to the second end 28. Each terminal 40 in the second set includes a tail portion 42 (see FIG. 5 which illustrates the tail portions 42) which extends from the second end 28 of the housing 24 for attachment to an alternate transmission medium, in this case, a cable 44 as described herein. The cable is preferably a flexible cable, but the invention is not so limited. The first set of terminals 36 are electrically isolated from the second set of terminals 40 by the housing 24 and the wall 34.

The combination connector 20 includes a pair of board mounting posts 46 which extend from the second end 28 of the housing 24 for insertion into corresponding mounting holes 48 on the backplane 22. A pair of posts 50 extend from the first end 26 of the housing 24 for mounting the mating device (not shown) thereto.

The cable 44 is attached to the tail portions 42 of the second set of terminals 40. The cable 44 can be permanently attached to the tail portions 42 of the second set of terminals 40, such as by soldering or other means. Alternatively, the cable 44 can be releasably attached to the tail portions 42 of the second set of terminals 40 such that the cable 44 can be easily attached and disengaged from the second set of terminals 40, such as with a connector 45 mounted on the cable 44 that mates with the tail portions 42.

The combination connector 20 is adapted for mounting to the backplane 22 through which power from a source or signals from an associated device are passed. The backplane 22 includes conventional means, such as tracings (not shown), for passing power to the combination connector 20 from a source (not shown). The backplane 22 includes mounting apertures 52 to allow insertion of the tail portions 38 of the first set of terminals 36 therein to allow the first set of terminals 36 to mate with the tracings. It is to be understood that other means for mounting the tail portions 38 to the backplane 22 can be provided, such as circuit traces to mount surface mount tails to the backplane. In addition to the mounting apertures 52 and the mounting holes 48, the backplane 22 includes an aperture 54 therethrough through which the cable 44 is inserted.

When the combination connector 20 is attached to the backplane 22, the tail portions 38 of the first set of terminals 36 are inserted into the corresponding mounting apertures 52 in the backplane 22, the mounting posts 46 of the combination connector 20 are seated into the corresponding apertures 48 in the backplane 22, and the cable 44 is passed through the aperture 54 in the backplane 22. While the first set of terminals 36 is described and shown herein as being plated through hole mounted, it is to be understood that the first set of terminals 36 can be mounted to the backplane 22 by surface mounting techniques.

Because signal can be passed directly through the combination connector 20 by way of the second set of terminals 40 and the cable 44, and not onto the backplane 22, this signal is isolated from the power being routed through the backplane 22. This allows for the direct transmission of high speed signals through the combination connector 20 by the second set of terminals 40 and the attached cable 44. Because the cable 44 can be designed with differing lengths, the termination point of the signal is not directly related to the backplane 22, i.e., the system to which the cable 44 is attached can be isolated from the backplane 22. In addition to enhanced isolation, backplanes have physical limits in terms of the signal travel length for high speed signals. The use of an alternate transmission medium, such as a cable, provides system designers with additional options for creating an optimized system because of the ability to extend the signal travel length.

Figure 2:
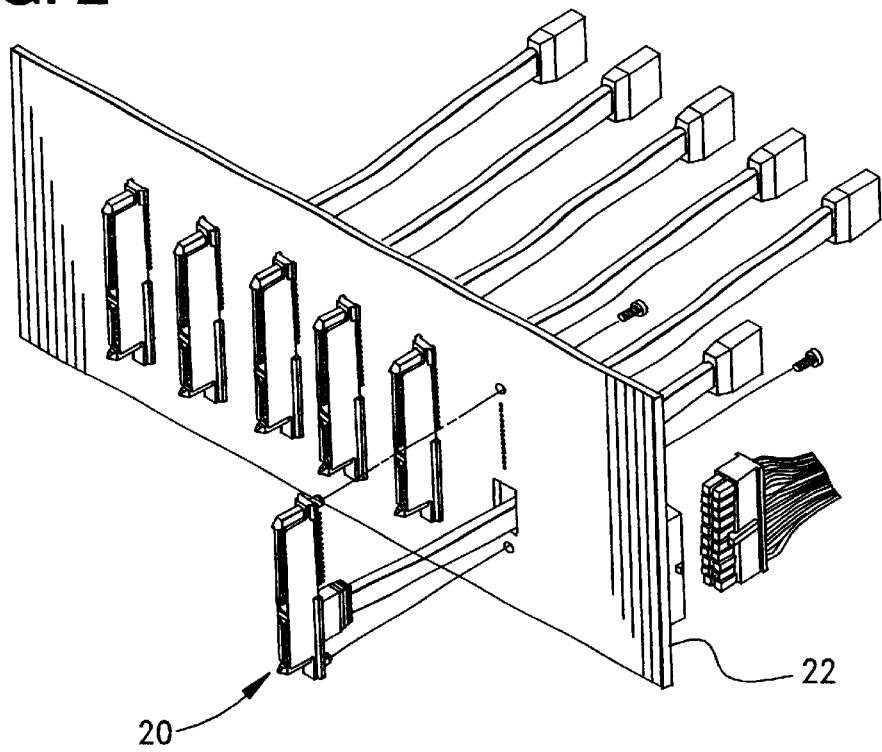
FIG. 2 is a perspective view of a plurality of the combination connectors which incorporates the features of the invention and a backplane.

Multiple combination connectors 20 can be connected to the same backplane 22, see FIG. 2, in the same manner as described herein.

The following configurations are possible using the combination connector 20:
1. electrical signal\electrical power;
2. electrical signal\optical signal; and
3. optical signal\electrical power;

In configuration number 1, the power is routed onto the backplane 22 and the signal is routed through the second set of terminals 40 and the cable 44. This configuration maintains signal integrity, and a less expensive backplane can be used, especially in high speed backplanes used in enterprise storage devices, routers, switches, hubs.

In configuration number 2, either the optical signal or the electrical signal can terminate onto the backplane 22 for routing to an appropriate device. The other of the optical signal or the electrical signal is routed through the second set of terminals 40 and the cable 44.

In configuration number 3, devices attached to backplane 22 can be powered, but the signal is allowed to pass therethrough. Applications for this configuration, among others, include telecom and medical. The properties of the optical fibers provide for ideal serial links in many applications (no effect from the EMI\RFI properties of the power).

Other configurations may be possible which are not listed above and the above list is not intended to limit the applications of the combination connector 20. Moreover, whereas the above configurations indicate that the power is routed onto the backplane, there may be instances where one would choose to route the power through the alternate transmission medium, in this case, the cable 44.

In a situation where a hard drive is provided, the power is routed through a simple, low cost printed circuit board. The signals pass through the backplane 22 and are routed directly to the printed circuit board where the silicon is located. One end of the cable 44 is connected to the combination connector 20. The opposite end of the cable 44 is terminated to a connector which plugs to the control printed circuit board.

An additional situation can have the power routed within a printed circuit board and component and device signals attached to the backplane 22 would be interconnected by cabling. An example would be a hard disk drive control module plugged into a backplane 22 alongside a bank of drives. The power is supplied through the printed circuit board and signal cables are run between the control module and the individual drives.

In addition, it is possible to have more than two sets of terminals 36, 40 in the combination electrical connector: 20. For example, as shown in FIGS. 6 and 7, a third set of terminals 60 (FIG. 6) or 62 (FIG. 7) within the housing 24 which is electrically isolated from the first set of terminals 36 and the second set of terminals 40 can be provided. The third set of terminals 60 may have a cable 64 attached to its tail portions or the terminals 62 may have tail portions terminated to the backplane 22.

In such a three-way combination, the following configurations are possible:

1. optical signal\electrical signal\electrical power; and
2. electrical signal\electrical signal\electrical power.

The second configuration of the three-way combination could be used in a dual Signal bay +power connector or a Serial SCSI.

Other three-way configurations may be possible which are not listed above and the above list is not intended to limit the applications of the combination connector.

While a preferred embodiment of the present invention is shown and described, it is envisioned that those skilled in the art may devise various modifications of the present invention without departing from the spirit and scope of the appended claims.

What is claimed is:

1. A connector capable of mating with a backplane, the connector comprising:

a housing having a first end and a second end;

a first set of terminals provided within the housing, the first set of terminals being capable of mating with the backplane at the second end of the housing;

a second set of terminals provided within the housing and being isolated from the first set of terminals; and an alternate transmission medium extending from the second set of terminals at the second end of the housing, the first set of terminals being used to pass a first transmission through the housing and the second set of terminals being used to pass a second transmission through the housing.

2. The connector of claim 1, wherein the alternate transmission medium is permanently attached to the second set of terminals.

3. The connector of claim 1, wherein the alternate transmission medium is capable of being detached from the second set of terminals.

4. The connector of claim 1, wherein the alternate transmission medium is a cable.

5. The connector of claim 1, wherein the first transmission is power.

6. The connector of claim 1, wherein the second transmission is a high speed signal.

7. The connector of claim 1, wherein the second transmission is an optical signal.

8. The connector of claim 1, wherein the second transmission is power.

9. The connector of claim 1, wherein the alternate transmission medium passes through an opening in the backplane.

10. A combination comprising:

a backplane; and a connector including a housing, a first set of terminals provided within the housing, the first set of terminals being capable of mating with the backplane, a second set of terminals provided within the housing and being isolated from the first set of terminals, and an alternate transmission medium extending from the housing, the alternate transmission medium being attached to the second set of terminals and extending through the backplane, the first set of terminals being used to pass a first transmission through the housing and the second set of terminals being used to pass a second transmission through the housing.

11. The combination of claim 10, wherein the alternate transmission medium is permanently attached to the second set of terminals.

12. The combination of claim 10, wherein the alternate transmission medium is capable of being releasably detached from the second set of terminals.

13. The combination of claim 10, wherein the first set of terminals and the second set of terminals are electrically isolated from each other within the housing by a wall.

14. The combination of claim 10, wherein the housing has a first end and a second end, the first set of terminals is capable of mating with the backplane at the second end of the housing, and the alternate transmission medium extends from the second set of terminals at the second end of the housing.

15. The combination of claim 10, wherein the alternate transmission medium is a cable.

16. The combination of claim 15, wherein the backplane includes an aperture through which the cable is passed.

17. A connector capable of mating with a backplane, the connector comprising:

a housing;

a first portion of the housing, the first portion of the housing being capable of mating to the backplane to transmit a first transmission to the backplane;

a second portion of the housing, the second portion of the housing being capable of transmitting a second transmission through the backplane without transmitting the second transmission to the backplane;

a third portion of the housing, the third portion of housing being capable of transmitting a third transmission.

18. The connector of claim 17, wherein the first transmission is power.

19. The connector of claim 17, wherein the second transmission is a high speed signal.

20. The connector of claim 17, wherein the second transmission is an optical signal.

21. The connector of claim 17, wherein the second transmission is power.

22. The connector of 17, wherein the third portion of the housing is capable of transmitting the third transmission to the backplane.

23. The connector of 17, wherein the third portion of the housing is capable of transmitting the third transmission through the backplane without transmitting the third transmission to the backplane.

* * * * *